US009172131B2

(12) United States Patent
Chen et al.

(10) Patent No.: US 9,172,131 B2
(45) Date of Patent: Oct. 27, 2015

(54) SEMICONDUCTOR STRUCTURE HAVING APERTURE ANTENNA

(71) Applicant: Advanced Semiconductor Engineering, Inc., Kaohsiung (TW)

(72) Inventors: Chi-Han Chen, Kaohsiung (TW); Chi-Tsung Chiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 309 days.

(21) Appl. No.: 13/834,424

(22) Filed: Mar. 15, 2013

(65) Prior Publication Data

US 2014/0266947 A1 Sep. 18, 2014

(51) Int. Cl.
| *H01Q 1/38* | (2006.01) |
| *H01Q 1/22* | (2006.01) |
| *H01Q 9/04* | (2006.01) |
| *H01Q 21/00* | (2006.01) |
| *H01Q 21/06* | (2006.01) |

(52) U.S. Cl.
CPC ........... *H01Q 1/2283* (2013.01); *H01Q 9/0457* (2013.01); *H01Q 21/0093* (2013.01); *H01Q 21/065* (2013.01); *H01L 2224/73204* (2013.01)

(58) Field of Classification Search
CPC .......... H01Q 1/2283; H01Q 1/38; H01Q 1/50
USPC .................................................. 343/700 MS
See application file for complete search history.

(56) References Cited

U.S. PATENT DOCUMENTS

| 4,814,205 | A | 3/1989 | Arcilesi et al. |
| 5,166,772 | A | 11/1992 | Soldner et al. |
| 5,353,498 | A | 10/1994 | Fillion et al. |
| 5,355,016 | A | 10/1994 | Swirbel et al. |
| 5,557,142 | A | 9/1996 | Gilmore et al. |
| 5,639,989 | A | 6/1997 | Higgins, III |
| 5,677,511 | A | 10/1997 | Taylor et al. |
| 5,694,300 | A | 12/1997 | Mattei et al. |
| 5,776,798 | A | 7/1998 | Quan et al. |
| 5,886,876 | A | 3/1999 | Yamaguchi |
| 5,895,229 | A | 4/1999 | Carney et al. |
| 5,998,867 | A | 12/1999 | Jensen et al. |
| 6,093,972 | A | 7/2000 | Carney et al. |
| 6,150,193 | A | 11/2000 | Glenn |
| 6,225,694 | B1 | 5/2001 | Terui |

(Continued)

FOREIGN PATENT DOCUMENTS

| JP | 8288686 | 1/1996 |
| WO | WO2004060034 | 7/2004 |

OTHER PUBLICATIONS

Huang et al., "Conformal Shielding Investigation for SiP Modules"; 2010 IEEE Electrical Design of Advanced Package & Systems Symposium, Dec. 2010.

*Primary Examiner* — Hoang V Nguyen
(74) *Attorney, Agent, or Firm* — Klein, O'Neill & Singh, LLP

(57) ABSTRACT

The semiconductor package includes a first substrate having a first surface and a second surface opposite to the first surface. A circuit portion is formed on the first surface of the substrate, wherein the circuit portion includes a wave guiding slot and a microstrip line overlapping the wave guiding slot. A chip is disposed on the circuit portion. An antenna is formed on the second surface of the substrate, wherein the antenna overlaps the wave guiding slot.

20 Claims, 3 Drawing Sheets

(56) References Cited

U.S. PATENT DOCUMENTS

| | | |
|---|---|---|
| 6,388,623 B1 * | 5/2002 | Sakota et al. .......... 343/700 MS |
| 6,614,102 B1 | 9/2003 | Hoffman et al. |
| 6,686,649 B1 | 2/2004 | Mathews et al. |
| 6,740,959 B2 | 5/2004 | Alcoe et al. |
| 6,757,181 B1 | 6/2004 | Villanueva |
| 6,781,231 B2 | 8/2004 | Minervini |
| 6,865,084 B2 | 3/2005 | Lin et al. |
| 6,881,896 B2 | 4/2005 | Ebihara |
| 6,917,526 B2 | 7/2005 | Ajioka et al. |
| 6,962,869 B1 | 11/2005 | Bao et al. |
| 6,998,532 B2 | 2/2006 | Kawamoto et al. |
| 7,030,469 B2 | 4/2006 | Mahadevan et al. |
| 7,042,398 B2 | 5/2006 | Tang et al. |
| 7,045,385 B2 | 5/2006 | Kim et al. |
| 7,049,682 B1 | 5/2006 | Mathews et al. |
| 7,081,661 B2 | 7/2006 | Takehara et al. |
| 7,109,410 B2 | 9/2006 | Arnold et al. |
| 7,125,744 B2 | 10/2006 | Takehara et al. |
| 7,129,422 B2 | 10/2006 | Arnold |
| 7,161,252 B2 | 1/2007 | Tsuneoka et al. |
| 7,180,012 B2 | 2/2007 | Tsuneoka et al. |
| 7,187,060 B2 | 3/2007 | Usui |
| 7,214,889 B2 | 5/2007 | Mazurkiewicz |
| 7,327,015 B2 | 2/2008 | Yang et al. |
| 7,342,303 B1 | 3/2008 | Berry et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,504,721 B2 | 3/2009 | Chen et al. |
| 7,576,415 B2 | 8/2009 | Cha et al. |
| 7,615,856 B2 | 11/2009 | Sakai et al. |
| 7,629,674 B1 | 12/2009 | Foster |
| 7,633,170 B2 | 12/2009 | Yang et al. |
| 7,633,765 B1 | 12/2009 | Scanlan et al. |
| 7,656,047 B2 | 2/2010 | Yang et al. |
| 7,675,465 B2 | 3/2010 | Doan et al. |
| 7,700,411 B2 | 4/2010 | Yang et al. |
| 7,745,910 B1 | 6/2010 | Olson et al. |
| 7,808,439 B2 | 10/2010 | Yang et al. |
| 7,829,981 B2 | 11/2010 | Hsu |
| 7,851,893 B2 | 12/2010 | Kim et al. |
| 7,872,343 B1 | 1/2011 | Berry |
| 7,944,038 B2 | 5/2011 | Chiu et al. |
| 7,989,928 B2 | 8/2011 | Liao et al. |
| 8,018,033 B2 | 9/2011 | Moriya |
| 8,022,511 B2 | 9/2011 | Chiu et al. |
| 8,030,750 B2 | 10/2011 | Kim et al. |
| 8,058,714 B2 | 11/2011 | Noll et al. |
| 8,061,012 B2 | 11/2011 | Carey et al. |
| 8,093,690 B2 | 1/2012 | Ko et al. |
| 8,110,902 B2 | 2/2012 | Eun et al. |
| 8,186,048 B2 | 5/2012 | Leahy et al. |
| 8,212,339 B2 | 7/2012 | Liao et al. |
| 2004/0150097 A1 | 8/2004 | Gaynes et al. |
| 2005/0029673 A1 | 2/2005 | Naka et al. |
| 2005/0039946 A1 | 2/2005 | Nakao |
| 2006/0017157 A1 * | 1/2006 | Yamamoto et al. .......... 257/728 |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002971 A1 | 1/2009 | Carey et al. |
| 2009/0025211 A1 | 1/2009 | Hiner et al. |
| 2009/0035895 A1 | 2/2009 | Lee et al. |
| 2009/0102003 A1 | 4/2009 | Vogt et al. |
| 2009/0102033 A1 | 4/2009 | Raben |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0256244 A1 | 10/2009 | Liao et al. |
| 2010/0032815 A1 | 2/2010 | An et al. |
| 2010/0110656 A1 | 5/2010 | Ko et al. |
| 2010/0199492 A1 | 8/2010 | Hiner et al. |
| 2010/0207257 A1 | 8/2010 | Lee |
| 2011/0115060 A1 | 5/2011 | Chiu et al. |
| 2011/0127654 A1 | 6/2011 | Weng et al. |
| 2011/0241969 A1 | 10/2011 | Zhang et al. |
| 2012/0062439 A1 | 3/2012 | Liao et al. |

* cited by examiner

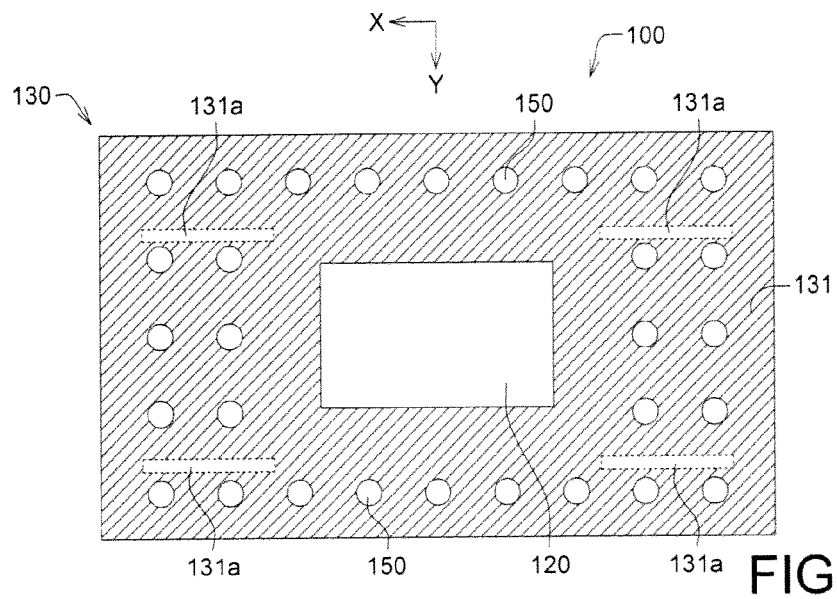
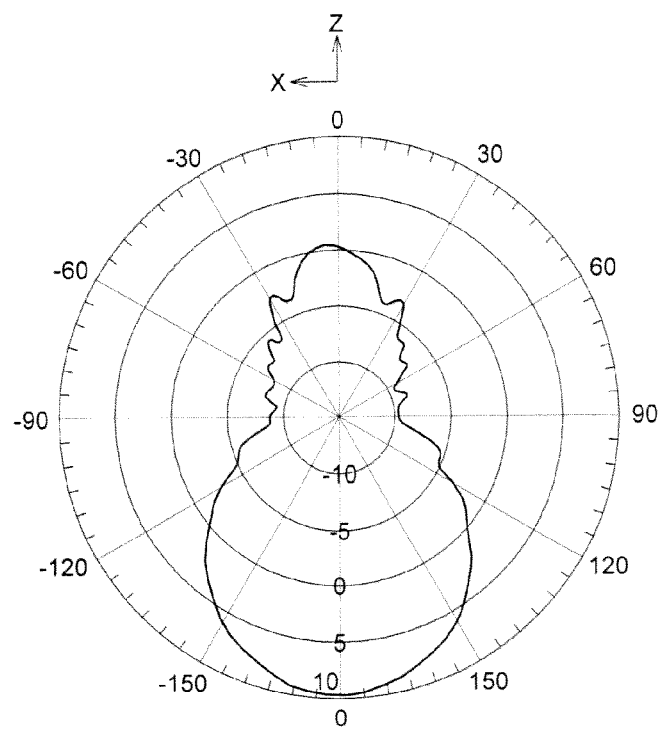
FIG. 1C
FIG. 2

SEMICONDUCTOR STRUCTURE HAVING APERTURE ANTENNA

BACKGROUND

1. Technical Field

The present embodiments relate in general to a semiconductor structure, and more particularly to a semiconductor structure with an aperture antenna.

2. Description of the Related Art

Wireless communication devices, such as cell phones, require antennas for transmitting and receiving radio frequency (RF) signals. Conventionally, a wireless communication device includes an antenna and a communication module (e.g., a semiconductor package with RF communication capability), each disposed on different parts of a circuit board. Under one conventional approach, the antenna and the communication module are separately manufactured and electrically connected after being placed on the circuit board. Accordingly, higher manufacturing costs are incurred and a compact product design as well as reduced device size are difficult to achieve.

Additionally, with increasing use of sensors, radar, high data rate links, and focused power, applications at millimeter-wave frequencies have become more critical. Among the advantages of working with short wavelengths are the related characteristics of size and resolution. That is, a physically small antenna structure is desirable. However, circuits for small antennas can be difficult to fabricate, since interconnections can easily be an appreciable fraction of a wavelength.

SUMMARY

One aspect of the disclosure relates to a semiconductor structure. In one embodiment, the semiconductor package includes a substrate, a circuit portion, a chip and an antenna. The substrate has a first surface and a second surface opposite to the first surface. The circuit portion is formed on the first surface of the substrate and includes a wave guiding slot and a microstrip line overlapped with the wave guiding slot up and down. The chip is electrically connected to the circuit portion. The antenna is formed on the second surface of the substrate and overlapped with the wave guiding slot up and down.

One aspect of the disclosure relates to a semiconductor structure. In one embodiment, the semiconductor package includes a substrate, an integrated passive layer, a chip and an antenna. The substrate has a first surface and a second surface opposite to the first surface. The integrated passive layer is formed on the first surface of the substrate and includes a plurality of wave guiding slots and a plurality of microstrip lines overlapped with the wave guiding slots up and down, wherein the wave guiding slots and the microstrip lines are arranged in the form of an array respectively. The chip is electrically connected to the circuit portion. The antenna is formed on the second surface of the substrate and overlapped with the wave guiding slot up and down.

BRIEF DESCRIPTION OF THE DRAWINGS

FIG. 1C illustrates a bottom view of the semiconductor structure of FIG. 1A;

FIG. 2 illustrates a field pattern in the X-Z plane of the semiconductor structure of FIG. 1A;

Common reference numerals are used throughout the drawings and the detailed description to indicate the same elements. The present invention will be more apparent from the following detailed description taken in conjunction with the accompanying drawings.

DETAILED DESCRIPTION

Figure 1A:
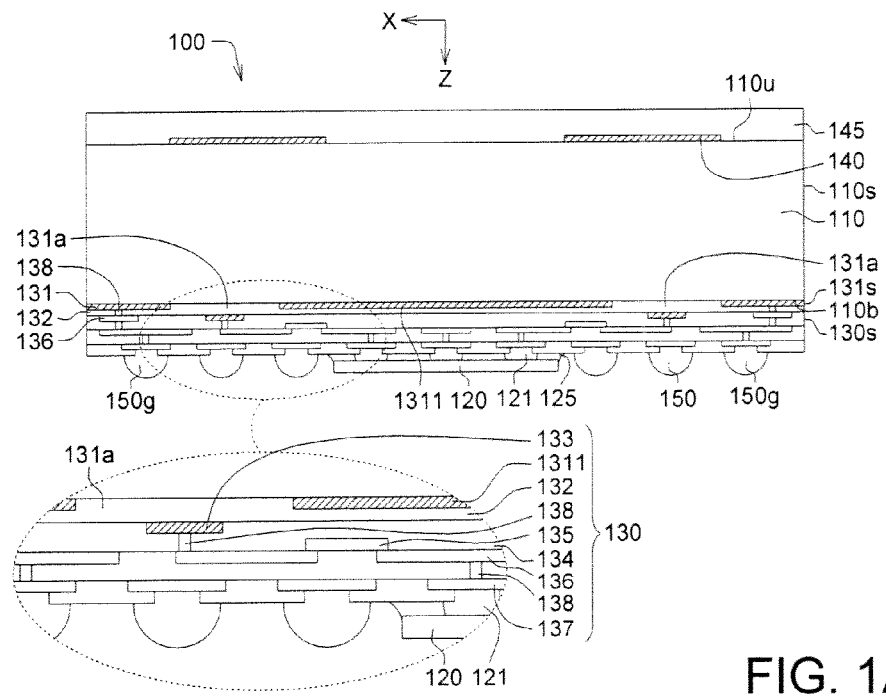
FIG. 1A illustrates a cross-sectional view of a semiconductor structure according to one of the present embodiments.

Referring to FIG. 1A, a cross-sectional view of a semiconductor structure 100, according to one of the present embodiments, is illustrated. The semiconductor structure 100 includes a substrate 110, a chip 120, a circuit portion 130, a plurality of antennas 140, an antenna dielectric layer 145, and a plurality of solder balls 150.

The substrate 110 has a first surface 110b and a second surface 110u opposite to the first surface 110b. If the substrate 110 is too thick, the wireless signal is difficult to radiate to the antenna 140 from the circuit portion 130, but if the substrate 110 is too thin, electromagnetic resonance coupling may not be produced. The substrate 110 may be made from glass, such that the wireless signal can be radiated to the antenna 140 from the circuit portion 130 through the substrate 110. Glass advantageously has high electrical resistance, such that the loss of the wireless signal transmitted by the antenna 140 is reduced and thus the efficiency of the wireless signal transmitted by the antenna 140 is promoted. In addition, since glass has a low K (dielectric constant), the efficiency of the antenna 140 is further improved. In some embodiments, the thickness of the substrate 110 is about half of the wavelength of the wireless signal for the antenna 140. For example, the thickness of the substrate 110 may be about 300 µm when an operating frequency is 60 GHz.

The circuit portion 130 is formed on the first surface 110b of the substrate 110 and may be a multi-layered structure. The circuit portion 130 includes a grounding layer 131, a first dielectric layer 132, and a plurality of microstrip lines 133, a second dielectric layer 134, a plurality of embedded phase shifters 135, a patterned conductive layer 136, a feeding network 137 and a plurality of vias 138.

The grounding layer 131 is formed on the first surface 110b of the substrate 110, and includes a shielding portion 1311 and a plurality of wave guiding slots 131a. A portion of the grounding layer 131 without the wave guiding slots 131a is defined as the shielding portion 1311, wherein the shielding portion 1311 overlaps the chip 120 as viewed in the vertical direction. As illustrated in FIG. 1A, the grounding layer 131 is electrically connected to a grounding solder ball 150g through the via 138 and the pattern conductive layer 136, wherein the grounding solder ball 150g may be electrically connected to an external grounding potential such that the grounding layer 131 is grounded. Since the shielding portion 1311 is a part of the grounding layer 131 electrically connected to the external grounding potential, the shielding portion 1311 is accordingly grounded and able to provide advantageous shielding. The area of the shielding portion 1311 is larger than that of the chip 120 to protect the chip 120 from electromagnetic interference (EMI). In addition, the shielding portion 1311 can prevent the circuit portion 130 from interference from the wireless signal emitted toward the antenna 140 from the microstrip lines 133. The wave guiding slots 131a overlap the microstrip lines 133 as viewed in the vertical direction for generating a coupling effect.

The first dielectric layer 132 covers the grounding layer 131, the wave guiding slots and the shielding portion 1311. In some embodiments, the first dielectric layer 132 can be made from a material such as a molding compound, a dielectric material (e.g., epoxy), or a prepreg lamination.

The microstrip lines 133 are formed beneath the first dielectric layer 132 and separated from the wave guiding slots 131a by the first dielectric layer 132. When an electrical current is transmitted through the microstrip lines 133, a first coupling resonance generated between the microstrip lines 133 and the wave guiding slots 131a causes the wireless signal to radiate to the substrate 110 from the edge of the wave guiding slots 131a, and then a second coupling resonance generated between the substrate 110 and the antenna 140 causes the wireless signal to radiate outward of the semiconductor structure 100 by the antenna 140. Due to two coupling resonances, the bandwidth of the wireless signal radiated from the antenna 140 is increased.

The second dielectric layer 134 covers the microstrip lines 133 and can be made from a material similar to that of the first dielectric layer 132. The embedded phase shifters 135 are embedded in the second dielectric layer 134 and electrically connected to the microstrip lines 133 and the feeding network 137 by the vias 138 and the patterned conductive layer 136. In addition, the embedded phase shifters 135 are electrically connected to the feeding network 137 by the vias 138 and the patterned conductive layer 136. The embedded phase shifters 135, which may be, for example, diodes, can adjust a phase of the wireless signal emitted or received by the antenna 140. In another embodiment, the embedded phase shifters 135 can be power amplifiers to modulate amplitude of the wireless signal. The feeding network 137 can transmit the signal from the chip 120 to the antenna 140.

In some embodiments, the circuit portion 130 can be an integrated passive layer That is, the circuit portion 130 includes at least one passive device such as a resistance, a capacitance, or an inductance, such that the circuit portion 130 and the semiconductor structure 100 form an Integrated Passive Device (IPD) with wireless function. The formation of the grounding layer 131, the microstrip lines 133, the embedded phase shifter 135, the patterned conductive layer 136, the feeding network 137 and the antenna 140 can be integrated with the IPD process. In addition, the passive device can be formed in the patterned conductive layer 136 or another layer.

Each of the circuit portion 130, the grounding layer 131 and the substrate 110 has an outer lateral surface 130s, 131s, 110s, respectively, wherein the outer lateral surface 131s of the grounding layer 131, the outer lateral surface 110s of the substrate 110, and the outer lateral surface 130s of the circuit portion 130 are flush with each other. The grounding layer 131 extends to the outer boundary of the semiconductor structure 100 to provide the EMI shielding.

The chip 120, which may be a transceiver chip, is disposed on the circuit portion 130 to process the wireless signal for the antenna 140. In some embodiments, the chip 120 may be a flip chip, which is disposed on the circuit portion 130 in a "face-down" orientation, and electrically connected to the circuit portion 130 via a plurality of solder balls 121. The solder balls 121 are covered by an under-fill 125. In another embodiment, the chip 120 may be disposed on the circuit portion 130 in a "face-up" orientation, and electrically connected to the circuit portion 130 via a plurality of conductive bond wires (not shown). An underfill 125 formed between the chip and the circuit portion 130 encapsulates and protects the solder balls 121.

The antenna 140 covered by the antenna dielectric layer 145 is formed on the second surface 110u of the substrate 110. The antenna 140 overlaps with the wave guiding slots 131a as viewed in the vertical direction for generating the second coupling resonance generated between the substrate 110 and the antenna 140. The antenna dielectric layer 145 can be made from a material similar to that of the first dielectric layer 132.

Figure 1B:
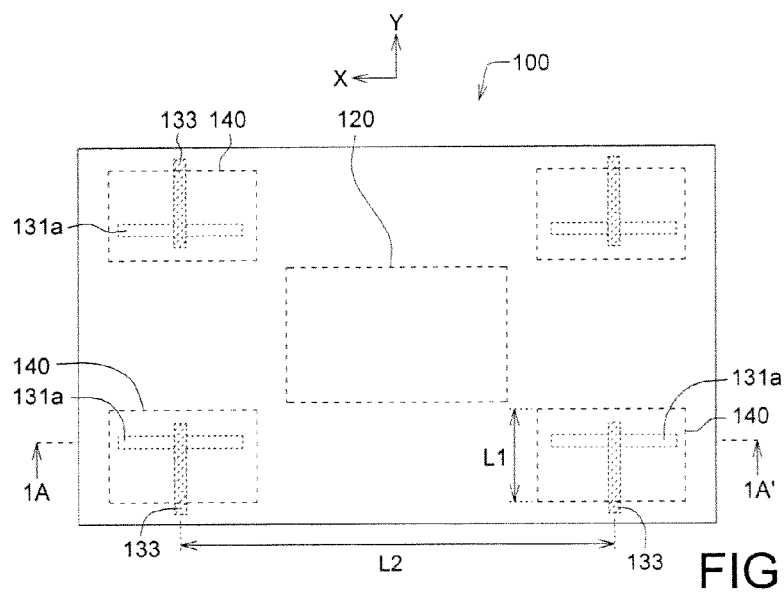
FIG. 1B illustrates a top view of the semiconductor structure of FIG. 1A.

Referring to FIG. 1B, a top view of FIG. 1A is illustrated. In the present embodiment, the wave guiding slots 131a are arranged in the form of a 2×2 array. In another embodiment, the wave guiding slots 131a can be arranged in the form of an n×m array for changing a field pattern of the wireless signal for the antenna 140, wherein n and m can be any positive integer. In one embodiment, the wave guiding slots 131a can be arranged in an arbitrary form and the number of the wave guiding slots 131a can be single. In practice, the form and the number of the wave guiding slots 131a depend on the impedance matching for the antenna 140.

As illustrated in FIG. 1B, microstrip lines 133 extend substantially perpendicular to the wave guiding slots 131a, such that the microstrip lines 133 and the wave guiding slots 131a together form a crisscross structure, which results in the excitation of two near-degenerate orthogonal modes of near-equal amplitudes and 90° phase difference. The longer the length L1 of the antenna 140 parallel to the microstrip lines 133 is, the lower the resonance frequency is. In one embodiment, the length L1 is less than 1000 micrometers for obtaining a large bandwidth of wireless signal and 60 GHz antenna.

The interval L2 between two adjacent microstrip lines 133 is about half of the wavelength of the wireless signal for the antenna 140, such that the wireless signal radiated to a middle position between two adjacent microstrip lines 133 generates a destructive interference (signal strength is counteracted), and thus most signal strength of the wireless signal is radiated upward from the microstrip lines 133. In addition, the antenna 140, the wave guiding slots 131a and the microstrip lines 133 overlap with each other to further improve the gain of antenna 140.

Referring to FIG. 1C, a bottom view of FIG. 1A is illustrated. The solder balls 150 are formed on the circuit portion 130 (illustrated in FIG. 1A) and around the chip 120. The semiconductor structure 100 can electrically connect to a printed circuit board (PCB) via the solder balls 150. The solder balls 150 project from a lower surface of the chip 120, and thus, electric connection between the semiconductor structure 100 and the printed circuit board can be ensured. In addition, the wave guiding slots 131a surround the chip 120, but do not overlap with the chip 120, such that the chip 120 can be overlapped with the shielding portion 1311 (without the wave guiding slots 131a) of the grounding layer 131 (oblique line region) and the electromagnetic interference (EMI) is reduced.

Referring to FIG. 2, a field pattern in the X-Z plane of the antenna of FIG. 1A is illustrated. Since the wave guiding slots 131a and the microstrip lines 133 are arranged in the form of an array, the directivity of the antenna 140 is excellent, and the gain can reach 10 dBi in a direction along −Z axial.

Figure 3:
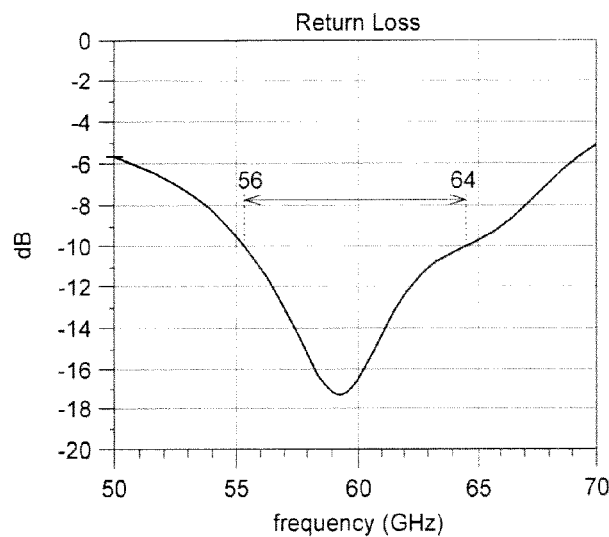
FIG. 3 illustrates a graph indicating a return loss pattern of the semiconductor structure of FIG. 1A.

Referring to FIG. 3, a graph indicating a return loss pattern of the antenna of FIG. 1A is illustrated. Because of the two coupling resonances, the bandwidth (below −10 dBi of return loss) of the antenna 140 ranges a large scope between 56 GHz and 64 GHz, such as 60 GHz.

Figure 4:
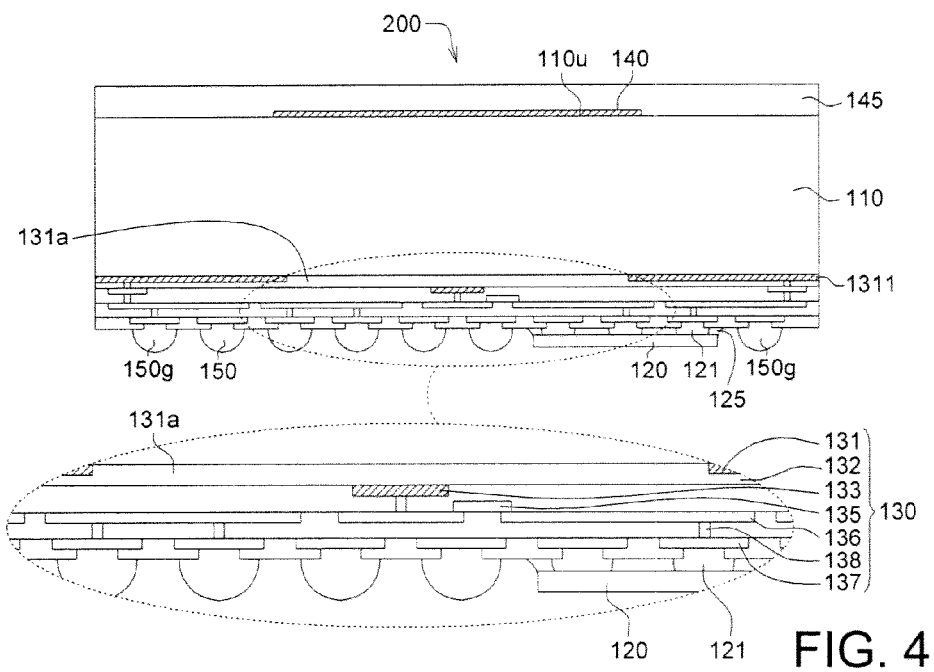
FIG. 4 illustrates a cross-sectional view of a semiconductor structure according to another of the present embodiments.

Referring to FIG. 4, a cross-sectional view of a semiconductor structure 200, according to another of the present embodiments, is illustrated. The semiconductor structure 200 includes a substrate 110, a chip 120, a circuit portion 130, an antenna 140, a dielectric layer 145 and a plurality of solder balls 150.

The circuit portion 130 includes a grounding layer 131, a first dielectric layer 132, and single microstrip line 133. The grounding layer 131 includes a shielding portion 1311 and a single wave guiding slot 131a overlapping the microstrip lines 133. The first dielectric layer 132 overlaps the grounding layer 131, such that the microstrip lines 133 are separated from the wave guiding slots 131a by the first dielectric layer 132. The chip 120 is disposed on the circuit portion 130 and electrically connected to the circuit portion 130 via a plurality solder balls 121. The chip 120 overlaps the shielding portion 1311 (an intact portion without the wave guiding slots 131a) of the grounding layer 131 for EMI protection.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor structure comprising:
   a substrate having a first surface and a second surface opposite to the first surface;
   a circuit portion formed on the first surface of the substrate and comprising a wave guiding slot and a microstrip line overlapped with the wave guiding slot;
   a chip disposed on the circuit portion wherein the microstrip line is positioned in the circuit portion outside a footprint of the chip; and
   an antenna formed on the second surface of the substrate and overlapped with the wave guiding slot.

2. The semiconductor structure of claim 1, wherein the circuit portion comprises a grounding layer overlapping the chip.

3. The semiconductor structure of claim 2, wherein the wave guiding slot is formed on the grounding layer.

4. The semiconductor structure of claim 2, wherein each of the grounding layer, the substrate, and the circuit portion has an outer lateral surface, the outer lateral surface of the grounding layer, the outer lateral surface of the substrate and the outer lateral surface of the circuit portion being flush with each other.

5. The semiconductor structure of claim 1, wherein the circuit portion has a plurality of the wave guiding slots which are not overlapped with the chip.

6. The semiconductor structure of claim 1, wherein an extension direction of the microstrip line is substantially perpendicular to that of the wave guiding slot.

7. The semiconductor structure of claim 1, wherein the antenna overlaps the wave guiding slot.

8. The semiconductor structure of claim 1, wherein the substrate is made from glass.

9. The semiconductor structure of claim 1, wherein the circuit portion comprises:
   a first dielectric layer formed between the grounding layer and the microstrip line.

10. The semiconductor structure of claim 1, further comprising:
    an antenna dielectric layer formed on the second surface of the substrate and covering the antenna.

11. A semiconductor structure comprising:
    a substrate having a first surface and a second surface opposite to the first surface;
    an integrated passive layer formed on the first surface of the substrate, comprising a plurality of wave guiding slots and a plurality of microstrip lines overlapped with the wave guiding slots, wherein the wave guiding slots and the microstrip lines are arranged in a form of an array;
    a chip disposed on the integrated passive layer, wherein the microstrip lines are positioned in the integrated passive layer outside a footprint of the chip; and
    a plurality of antennas formed on the second surface of the substrate and overlapping the wave guiding slots.

12. The semiconductor structure of claim 11, wherein the integrated passive layer comprises a grounding layer overlapping the chip.

13. The semiconductor structure of claim 12, wherein the wave guiding slots are formed on the grounding layer.

14. The semiconductor structure of claim 12, wherein each of the grounding layer, the substrate, and the integrated passive layer has an outer lateral surface, the outer lateral surface of the grounding layer, the outer lateral surface of the substrate, and the outer lateral surface of the integrated passive layer are flush with each other.

15. The semiconductor structure of claim 11, wherein the integrated passive layer has a plurality of the wave guiding slots which are not overlapped with the chip.

16. The semiconductor structure of claim 11, wherein an extension direction of each microstrip line is substantially perpendicular to that of the corresponding wave guiding slot.

17. The semiconductor structure of claim 11, wherein the antennas overlap the wave guiding slots.

18. The semiconductor structure of claim 11, wherein the substrate is made from glass.

19. The semiconductor structure of claim 11, wherein the integrated passive layer comprises:
    a first dielectric layer formed between the grounding layer and the microstrip lines.

20. The semiconductor structure of claim 11, further comprising an antenna dielectric layer formed on the second surface of the substrate and covering the antennas.

* * * * *